United States Patent [19]
Nishimoto

[11] Patent Number: 6,057,005
[45] Date of Patent: May 2, 2000

[54] METHOD OF FORMING SEMICONDUCTOR THIN FILM

[75] Inventor: Tomonori Nishimoto, Kyotanabe, Japan

[73] Assignee: Canon Kabushiki Kaisha, Tokyo, Japan

[21] Appl. No.: 08/986,825

[22] Filed: Dec. 8, 1997

[30] Foreign Application Priority Data

Dec. 12, 1996 [JP] Japan .................................. 8-352131

[51] Int. Cl.$^7$ .............................. H05H 1/24; B05D 3/06
[52] U.S. Cl. .......................................... 427/578; 427/573
[58] Field of Search .................................. 427/578, 573; 438/488

[56] References Cited

U.S. PATENT DOCUMENTS

| | | | |
|---|---|---|---|
| 4,400,409 | 8/1983 | Izu et al. ..................................... | 427/39 |
| 4,633,809 | 1/1987 | Hirose et al. ............................. | 118/719 |
| 4,962,727 | 10/1990 | Harada ..................................... | 118/723 |
| 5,540,781 | 7/1996 | Yamagami et al. .................. | 118/723 E |

FOREIGN PATENT DOCUMENTS

| | | |
|---|---|---|
| 59-016328 | 1/1984 | Japan . |
| 59-056724 | 4/1984 | Japan . |
| 61-284918 | 12/1986 | Japan . |
| 1-147072 | 6/1989 | Japan . |

OTHER PUBLICATIONS

Hatanaka et al, Mater. Res. Soc. Symp. Proc., 403(Polycrystalline Thin Films: Structure, Texture, Properties and Applications II) 1996 (Abstract) No month data!

M. Heintz et al., "VHF Plasma Deposition for Thin–film Solar Cells", Progress in Photovoltaics: Research and Applications, 1993, pp. 213–224. No month data!

A. Shah, et al., "High Rate Deposition of Amorphous Silicon by VHF Glow Discharge for Solar Cell Applications", Photovoltaic Solar Energy Conference, 1988, pp. 876–880. No month data!

T. Watanabe, et al., "Microwave–Excited Plasma CVD of a–Si:H Films Utilizing a Hydrogen Plasma Stream or by Direct Excitation of Silane," *Japanese Journal of Applied Physics*, vol. 26, No. 8, Aug. 1987, pp. 1215–1218.

J. Meier, et al., "Intrinsic Microcrystalline Silicon ($\mu$c–Si:H)—A Promising New Thin Film Solar Cell Material," *First WCPEC*, Dec. 5–9 1994, Hawaii, pp. 409–412.

Takeshi Watanabe, et al., "Chemical Vapor Deposition of a–SiGe:H Films Utilizing a Microwave–Excited Plasma", *Japanese Journal of Applied Physics, JJAP Letters*, vol. 26, No. 4, Apr. 1987, pp. L288–L290.

A. Matsuda, et al., "Preparation of highly photosensitive hydrogenated amorphous Si–Ge alloys using a triode plasma reactor", *Applied Physics Letters*, vol. 47, Nov. 1985, pp. 1061–1063.

*Primary Examiner*—Roy V. King
*Attorney, Agent, or Firm*—Fitzpatrick, Cella, Harper & Scinto

[57] ABSTRACT

The present invention provides a forming method of a semiconductor thin film by a plasma CVD process comprising introducing a source gas and a high-frequency power into a film forming chamber to generate a plasma therein, thereby forming a semiconductor thin film on a substrate, wherein the frequency of the high-frequency power is within a range of 50 MHz to 2 GHz, the input power density thereof is within a range of 0.001 to 1.0 W/cm$^3$, the discharge pressure is within a range of 0.005 to 0.5 Torr, the temperature of the substrate is within a range of 150 to 500° C., and wherein a metal mesh is disposed so as to substantially confine the plasma between the substrate and a source gas introducing portion, thereby forming the semiconductor thin film.

16 Claims, 7 Drawing Sheets

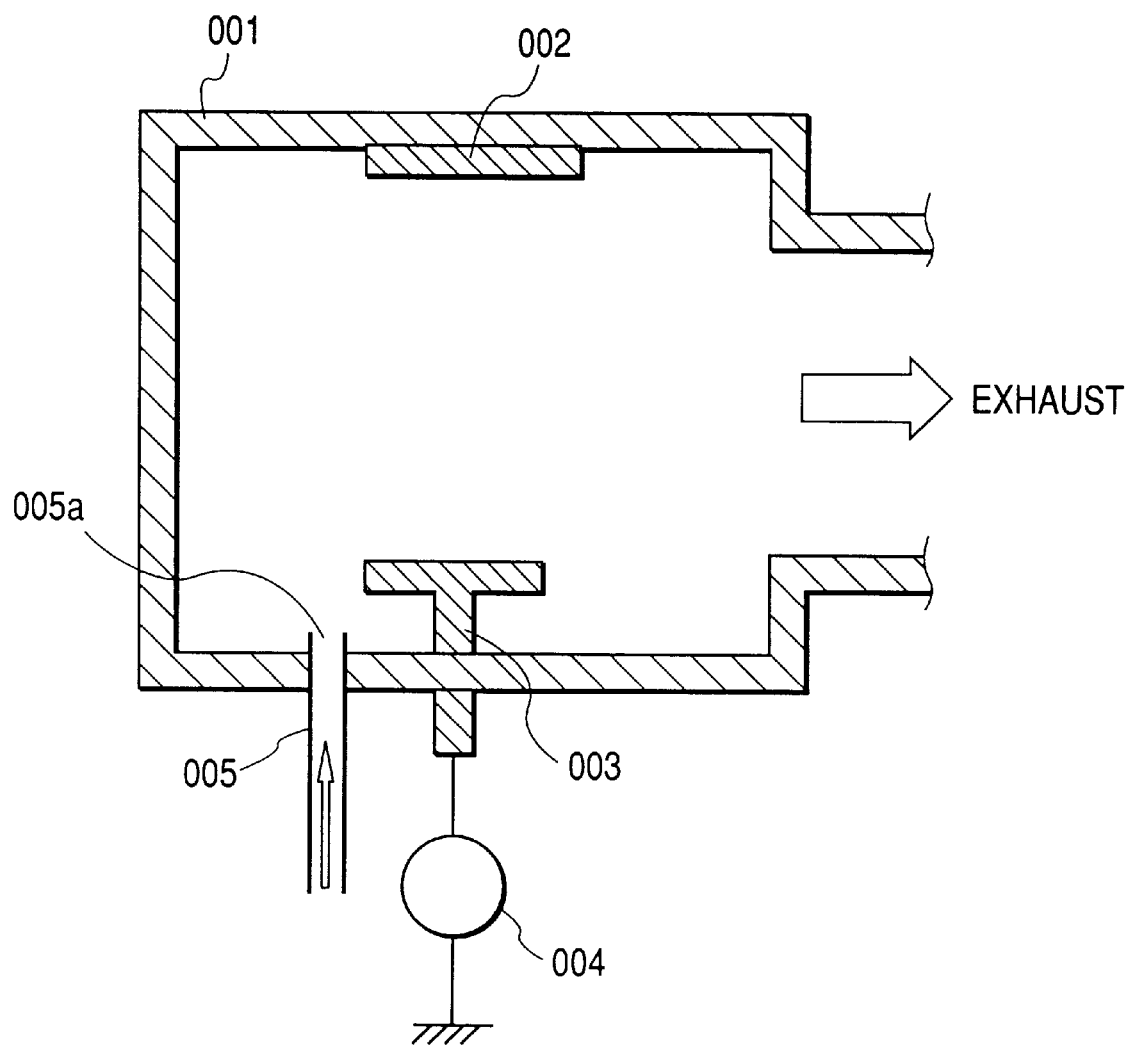

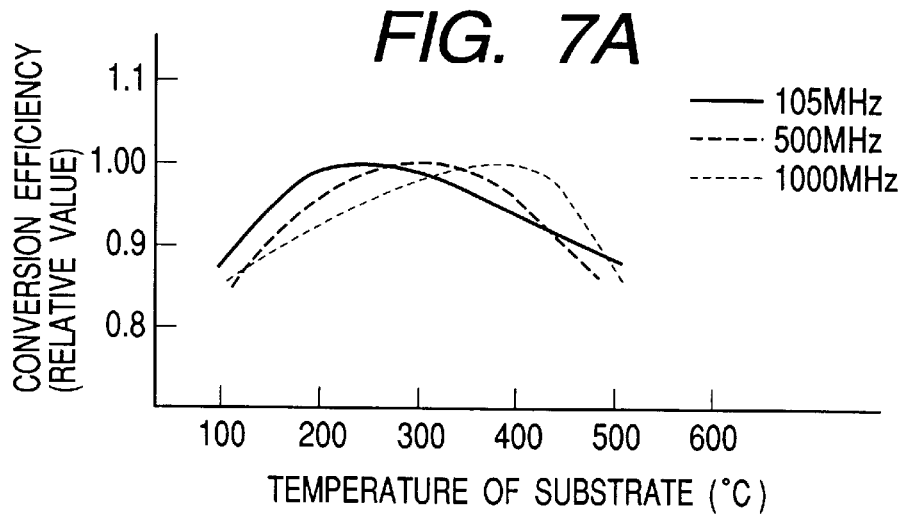
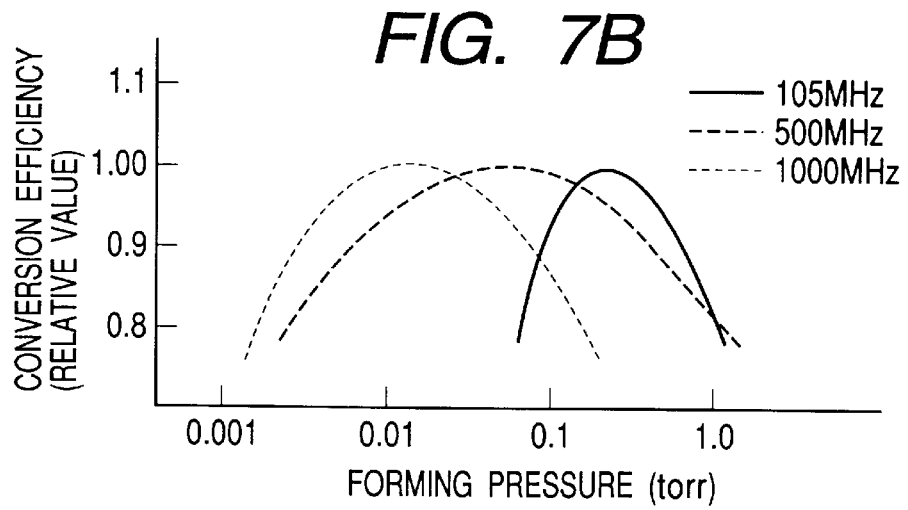
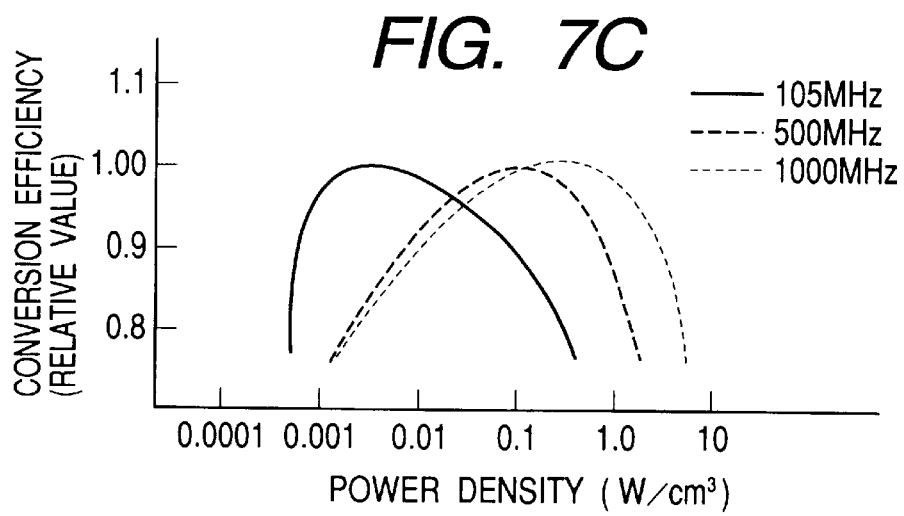

METHOD OF FORMING SEMICONDUCTOR THIN FILM

BACKGROUND OF THE INVENTION

1. Field of the Invention

The present invention relates to a method of forming a semiconductor thin film using high frequency and a source gas for formation of a semiconductor and, more particularly, to a method for forming an amorphous semiconductor thin film containing a microcrystalline layer, or a microcrystalline semiconductor thin film.

2. Related Background Art

In general, the plasma enhanced CVD process is widely used, for example, for fabrication of photovoltaic elements using amorphous silicon films or the like and is industrialized. In order for photovoltaic elements to meet the demand for electric power, however, the following fundamental requirements must be met by the photovoltaic elements used: photoelectric conversion efficiency thereof must be sufficiently high; they must have excellent stability; and they must be mass-producible.

To meet these requirements, fabrication of photovoltaic elements using amorphous silicon films or the like is intended to achieve improvements in electrical, optical, photoconductive, or mechanical characteristics and in fatigue characteristics or operating environment characteristics in repetitive use, and to allow mass production with repeatability by high-speed film formation, while also achieving increased film area and uniformity of the thickness and the quality of the film. These are problems to be solved in the future.

Many reports have been presented heretofore as to deposited film forming methods by the microwave plasma enhanced CVD process.

For example, the microwave-excited plasma CVD process using ECR is described in the following references:

"Chemical Vapor deposition of a-SiGe:H films utilizing a microwave-excited plasma," T. Watanabe, M. Tanaka, K. Azuma, M. Nakatani, T. Sonobe, T. Simada, Japanese Journal of Applied Physics, Vol. 26, No. 4, April, 1987, pp. L288–L290;

"Microwave-excited plasma CVD of a-Si:H films utilizing a hydrogen plasma stream or by direct excitation of silane," T. Watanabe, M. Tanaka, K. Azuma, M. Nakatani, T. Sonobe, T. Simada, Japanese Journal of Applied Physics, Vol. 26, No. 8, August, 1987, pp. 1215–1218, and so on.

Further, "Plasma vapor phase reaction apparatus" in Japanese Patent Application Laid-Open No. 59-16328 describes a method for depositing a semiconductor film by the microwave plasma CVD process. Furthermore, "Thin film forming method by microwave plasma" in Japanese Patent Application Laid-Open No. 59-56724 also describes a method for depositing a semiconductor film by the microwave plasma CVD process.

Another forming method of a deposited film with provision of a third electrode of a mesh shape between the anode and the cathode in the RF plasma enhanced CVD process is described in "Preparation of highly photosensitive hydrogenated amorphous Si—Ge alloys using a triode plasma reactor," A. Matsuda et al., Applied Physics Letters, Vol. 47 No. 10, 15, November, 1985 pp. 1061–1063.

Further, many electric power generation methods using the photovoltaic elements employ a method for connecting unit modules in series or in parallel to form a unit, thereby obtaining desired electric current and voltage. In that case each module is required to be free from wire breakage and short circuits. In addition, an important requirement is that there are no variations in output voltage and output current among the modules.

These require securing uniformity of the semiconductor layers themselves, since they are the most characteristic-decisive elements, at least in the stage of forming each unit module.

From the viewpoints of facilitating module design and simplifying module assembling steps, providing a semiconductor deposited film with excellent uniformity of features over a large surface area is required in order to enhance the mass producibility of photovoltaic elements and to achieve great reduction of production cost.

In the photovoltaic element, the semiconductor layers, which are important constituents thereof, compose a semiconductor junction such as the so-called pn junction or pin junction.

In the case of thin film semiconductors of amorphous silicon or the like being used, it is known that when a source gas containing an element being a dopant, such as phosphine ($PH_3$) or diborane ($B_2H_6$), is mixed with a main source gas such as silane, they undergo glow discharge decomposition to obtain a semiconductor film having a desired conductivity type, and such semiconductor films are stacked in order on a desired substrate, thereby readily attaining the aforementioned semiconductor junctions.

Proposed from this point as to formation of amorphous-silicon-based photovoltaic elements are methods for providing independent film forming chambers for formation of the respective semiconductor layers and for carrying out formation of the respective semiconductor layers in the associated film forming chambers.

Incidentally, U.S. Pat. No. 4,400,409 discloses a continuous plasma CVD apparatus employing the roll-to-roll system. It is described therein that this apparatus can continuously fabricate the element having the semiconductor junctions by providing a plurality of glow discharge regions, setting a sufficiently long, flexible substrate of a desired width along a path in which the substrate successively passes through the glow discharge regions, and continuously conveying the substrate in the longitudinal direction thereof while depositing the semiconductor layers of the desired conductivity types in the respective glow discharge regions.

In the U.S. patent, gas gates are used in order to prevent the dopant gas used upon formation of each semiconductor layer from diffusing or mixing into other glow discharge regions. Specifically, the system employs means for separating the glow discharge regions from each other by slit-shaped separation passages and for forming a flow of scavenging gas, for example Ar, $H_2$, or the like, in the separation passages.

Therefore, this roll-to-roll system is a system suitable for mass production of semiconductor elements, but, as described previously, further improvements in the photoelectric conversion efficiency, characteristic stability, and characteristic uniformity, and the reduction of production cost are necessary for widespread and volume use of photovoltaic elements.

Particularly, for the improvements in the photoelectric conversion efficiency and characteristic stability, it is a matter of course that the photoelectric conversion efficiency and characteristic deterioration rate of each unit module should be improved in the 0.1% order (corresponding to approximately 1.01 times by ratio). Further, when the unit modules are connected in series or in parallel to form a unit, a unit module of the minimum current or voltage characteristic out of the unit modules constituting the unit becomes a rate-limiting module so as to determine the characteristics of the unit. Therefore, it is very important to decrease characteristic variations, as well as to improve the average characteristics of each unit module.

It is thus demanded that the characteristic uniformity of the semiconductor layers themselves, being the most characteristic-decisive elements, be secured at the stage of forming the unit modules.

It is also strongly demanded that the yield be increased by decreasing defects of the semiconductor layers so as to avoid the breaking of wire and short circuits in each module, to decrease the production cost.

Attempts have been made in recent years to use microcrystalline silicon for the constituent layers of an amorphous silicon solar cell. For example, a pin element comprised of microcrystalline silicon produced by use of VHF of frequency 70 MHz and being free from optically induced deterioration is reported in "Intrinsic Microcrystalline Silicon ($\mu$c-Si:H)—A Promising New Thin Film Solar Cell Material," J. Meier, S. Dubail, R. Fluckiger, D. Fisher, H. Keppner, A. Shah, Proceedings of First WCPEC; Dec. 5–9, 1994; Hawaii, pp. L409–L412.

In the case of the pin element free from optically induced deterioration made of microcrystalline silicon, however, the photoelectric conversion efficiency thereof is not more than 5% in the form of a cell of the single structure. When compared with the existing amorphous silicon solar cells, it cannot be regarded as good efficiency, even taking it into consideration that the amorphous silicon solar cells are subject to optically induced deterioration.

Further, it is generally known hitherto that the deposition rate of microcrystalline silicon film is as slow as not more than 1 Å/s and that the thickness of microcrystalline silicon layer necessary for exhibiting the sufficient characteristics as a solar cell is not less than 1 $\mu$m. Therefore, the problem was that the throughput in mass production was not easy to increase.

As described above, microcrystalline silicon has the excellent feature of not suffering the optically induced deterioration on one hand, but it also had disadvantages of low conversion efficiency and inferior mass producibility when applied to solar cells.

SUMMARY OF THE INVENTION

For solving the problems described above, it is, therefore, an object of the present invention to provide a method of forming a semiconductor thin film that permits a microcrystalline silicon film with excellent electrical and optical characteristics to be formed even at high forming rates of the semiconductor thin film of not less than several Å/s, that enhances the stability of discharge to increase the yield of the elements upon mass production, and that can enhance maintainability.

For solving the above problems, the present invention provides a method of forming a semiconductor thin film by a plasma CVD process, which comprises introducing a source gas and a high frequency power into a film forming chamber to generate a plasma therein and to form a semiconductor thin film on a substrate, wherein the frequency of the high-frequency power is within a range of 50 MHz to 2 GHz, and wherein under a discharge pressure within a range of 0.005 to 0.5 Torr a metal mesh is disposed so as to substantially confine the plasma therein, between the substrate and a source gas introducing portion, thereby forming the semiconductor thin film. On that occasion, the temperature of the substrate is 150 to 500° C. and the input power density is 0.001 to 1.0 W/cm$^3$.

In the present invention, the frequency is more preferably within a range of 100 to 600 MHz.

In the present invention, the metal mesh may be constructed so as to be electrically grounded to the film forming chamber; or the metal mesh may be constructed so as to be electrically insulated from the film forming chamber and a DC bias or an RF bias may be applied to the metal mesh.

In the present invention, the metal mesh may be arranged to be energized to heat.

In the present invention, the metal mesh may be made of at least one element selected from Fe, Al, Cu, Ni, and W and an aperture percentage of the mesh is preferably 30 to 95%.

In the present invention, the semiconductor thin film suitably formed is an amorphous semiconductor containing a microcrystalline layer, or a microcrystalline semiconductor.

BRIEF DESCRIPTION OF THE DRAWINGS

FIGS. 7A, 7B and 7C are graphs showing substrate temperature dependence, forming pressure dependence, and power density dependence, respectively, of conversion efficiency;

DETAILED DESCRIPTION OF THE PREFERRED EMBODIMENTS

The inventor of the present invention has conducted extensive and intensive research in order to solve the above problems and has consequently found that a method for forming a microcrystalline silicon film (which also includes an amorphous silicon film containing a microcrystalline layer) of high quality can effectively be attained by using a high frequency within a range of 50 MHz to 2 GHz (2000 MHz) and substantially confining the plasma by a metal mesh in the pressure range of 0.005 to 0.5 Torr, and, if necessary, by applying a bias of DC or RF to the metal mesh or by energizing the metal mesh to heat.

The details are not clear as to why the substantial confinement of plasma by a metal mesh contributes to enhancement of the quality of a microcrystalline silicon film as described above, but probable causes are 1 to 4 below.

1. Since the high-frequency power can be concentrated in the space surrounded by the mesh, and since the mesh substantially decreases the exhaust conductance, the decomposition and activation of a film-forming gas can be promoted to generate the plasma in a high density. When the mesh is grounded, abnormal charge accumulation in the plasma can be eliminated quickly, which can suppress abnormal discharge such as a spark to enhance the stability of discharge.

Figure 5:
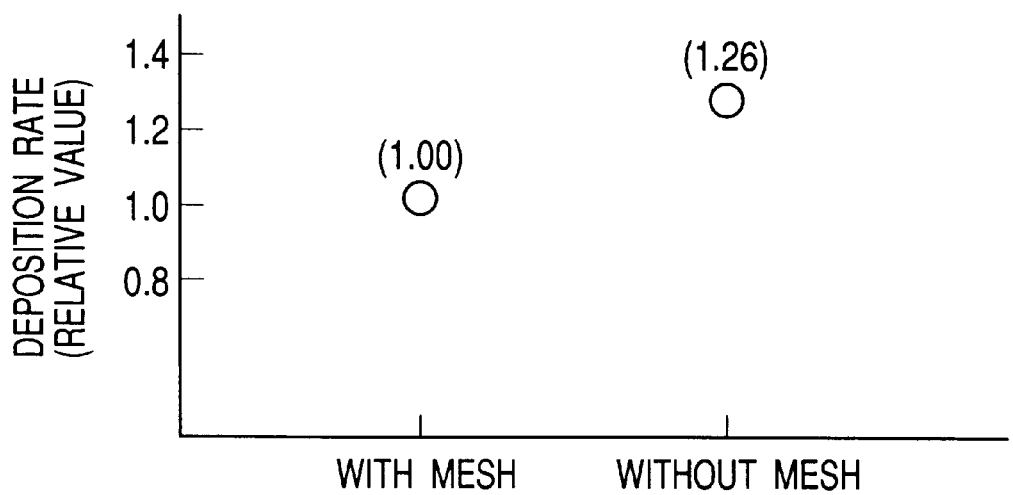
FIG. 5 is a graph showing a deposition rate increasing effect by use of the metal mesh of the present invention.

FIG. 5 shows a comparison of deposition rates upon deposition of i-type microcrystalline silicon thin films without use of the metal mesh and with use of the metal mesh as grounded.

The deposition rate was able to be increased by confining the plasma using the metal mesh as grounded. Further, when the metal mesh was used, the number of occurrence of abnormal discharges (sparks) was decreased greatly, to about one third.

2. It also becomes possible to electrically insulate the metal mesh from the film forming chamber and apply a bias of DC, RF, or the like to the metal mesh as occasion may demand, thereby optionally selecting thin film forming species in the plasma.

When the mesh is energized to heat, the source gas can be decomposed, thereby promoting formation of the thin film.

3. Scattering of peeled films can be decreased from the wall surface of the film forming chamber into the plasma, whereby the stability of discharge can be enhanced, thus improving the quality of the thin film to be formed.

4. Since diffusion of plasma is restrained, film deposition on portions except for a desired portion, for example, on the wall surface of the film forming chamber can be prevented, which improves maintainability.

Figure 2:
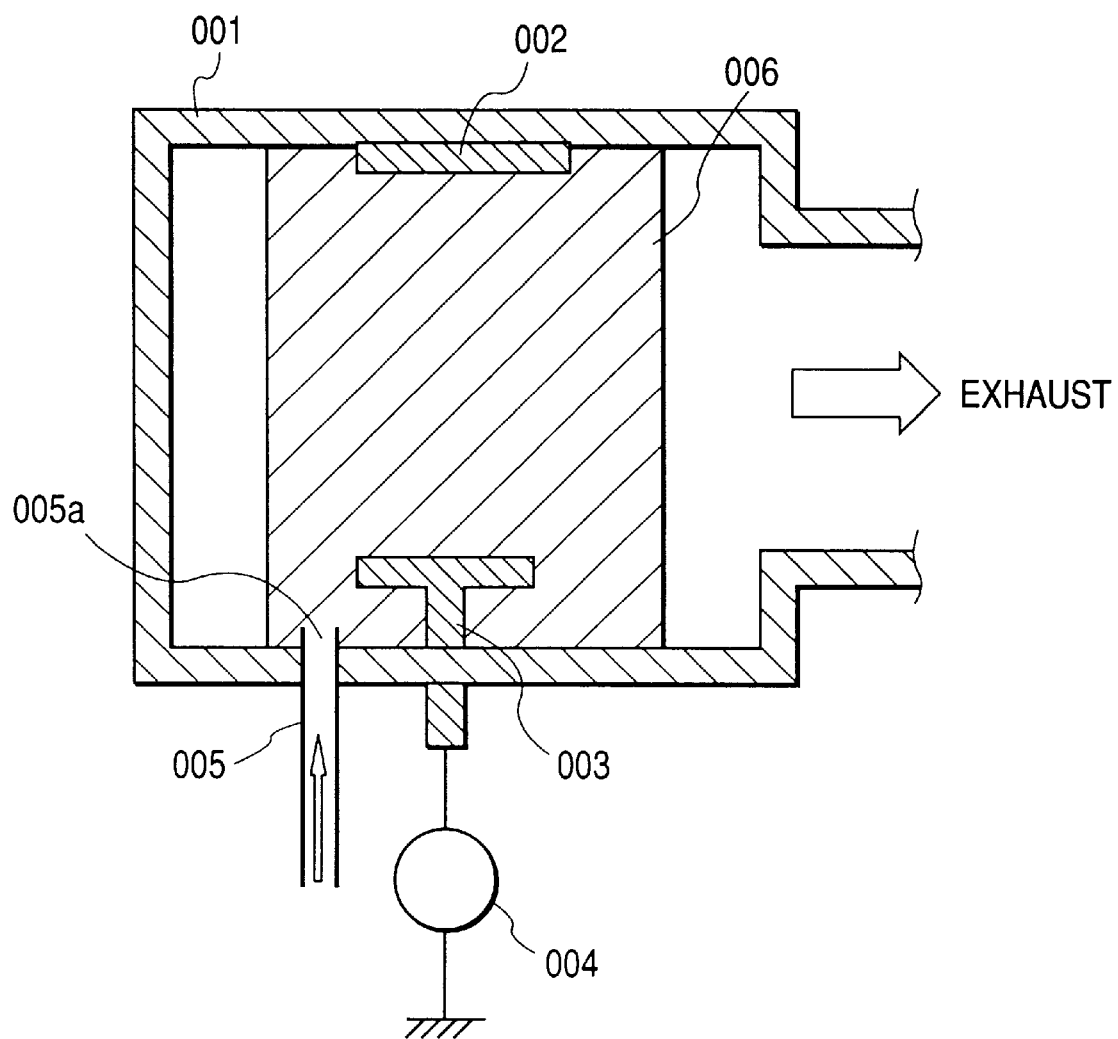
FIG. 2 is a schematic, cross-sectional view showing a film forming apparatus according to Example 1 of the present invention.

FIG. 2 shows a schematic view for specifically explaining the details of the present invention.

A substrate 002 is held on the top part of a film forming chamber 001 and is heated to be kept at a desired temperature.

A film-forming gas is supplied through a source gas inlet pipe 005 to be introduced from the bottom part into the inside of the film forming chamber 001.

The film-forming gas is exhausted to the right in the same drawing by an exhaust pump (not shown). High-frequency power is supplied from a high-frequency power supply 004 to be introduced through a high-frequency electrode 003 into the inside of the film forming chamber 001 to decompose and excite the source gas, thereby generating a plasma.

Figure 1:
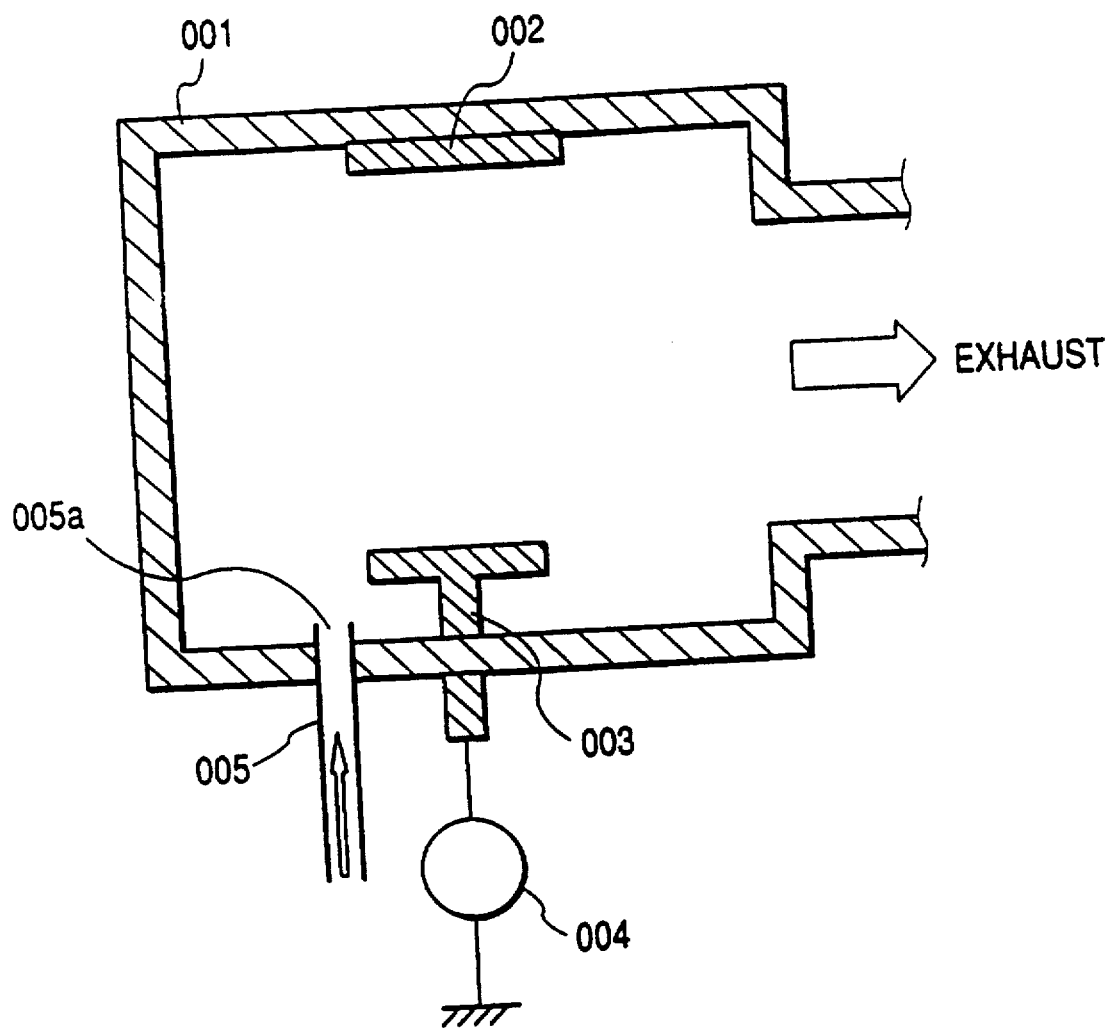
FIG. 1 is a schematic, cross-sectional view showing a conventional film forming apparatus.

The apparatus of this embodiment is different from that of the conventional example shown in FIG. 1 in that the substrate 002, the high-frequency electrode 003, and the source gas introducing portion 005a are surrounded by a metal mesh 006 and the generated plasma is substantially confined in the metal mesh 006.

As the source gas for forming a microcrystalline silicon film, there may be included those compounds which contain silicon atoms and are gasifiable, for example, such compounds as $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, $SiFD_3$, $SiF_2D_2$, $Si_2D_3H_3$, or $SiH_2Cl_2$.

These compounds containing silicon atoms can be used singly or can be mixed with a diluent gas such as $H_2$, He, Ar, Ne, Kr, or Xe.

Forming conditions suitably adaptable for formation of a microcrystalline silicon film are as follows: the frequency of the high-frequency power is within a range of 50 to 2000 MHz; the input power density of the high-frequency power is within a range of 0.001 to 1.0 $W/cm^3$; the discharge pressure is within a range of 0.005 to 0.5 Torr; and the temperature of the substrate is within a range of 150 to 500° C.

Particularly, when the frequency of the high-frequency power is within a range of 50 to 200 MHz, preferred conditions are as follows: the temperature of the substrate is within a range of 150 to 500° C.; the forming pressure is within a range of 0.1 to 0.5 Torr; and the input power density of the high-frequency power is within a range of 0.001 to 0.2 $W/cm^3$.

Furthermore, when the frequency of the high-frequency power is within a range of 200 to 550 MHz, preferred conditions are as follows: the temperature of the substrate is within a range of 150 to 500° C.; the forming pressure is within a range of 0.01 to 0.3 Torr; and the input power density of the high-frequency power is within a range of 0.01 to 0.5 $W/cm^3$.

Furthermore, when the frequency of the high-frequency power is within a range of 550 to 2000 MHz, preferred conditions are as follows: the temperature of the substrate is within a range of 150 to 500° C.; the forming pressure is within a range of 0.005 to 0.1 Torr; and the input power density of the high-frequency power is within a range of 0.01 to 1.0 $W/cm^3$.

The material for forming the metal mesh is selected preferably from single metals such as Fe, Al, Cu, Ni, or W or alloys thereof. Particularly preferable materials are Al in terms of ease to process and W in terms of excellent resistance to energization-heating (resistance heating). From the viewpoint of quickly moving charged particles in the plasma to the ground potential, the resistivity of the material forming the metal mesh is preferably not more than $1 \times 10^{-5}$ $\Omega \cdot cm$. A suitable shape of the metal mesh is one obtained by knitting a wire material, because it can increase the aperture percentage readily while maintaining the mechanical strength of the metal mesh. A mesh obtained by finely cutting a plate material and expanding it (expanded metal) or a punched metal or the like is particularly suitable for the purpose of quickly removing the charge from the charged particles in the plasma, because electrical contact of the entire mesh is perfect. When the surface area of the metal part of the metal mesh surrounding the plasma is desired to be set as large as possible, the expanded metal is preferred; conversely, if the surface area is desired to be set small, the punched metal is preferred. Further, in the metal mesh of either type, the aperture percentage is preferably 30 to 95% and the length of aperture portions is preferably within a range of 5–30 mm, from the viewpoints of capability of securing selectivity of active species in the plasma and the shielding property for high frequency and of capability of restraining the deposited-film-forming particles from scattering to the outside of the metal mesh, and thereby enhancing the maintainability of film forming chamber.

EXAMPLES

The present invention will be described in further detail using examples thereof, but it is noted that the present invention is by no means intended to be limited to these examples.

Example 1

FIG. 2 shows Example 1 of the present invention.

The substrate is held in the top part of the film forming chamber 001 and is heated to be kept at a desired temperature.

The film-forming gas is guided through the source gas inlet pipe 005 to be introduced from the bottom part into the inside of the film forming chamber 001.

The film-forming gas is exhausted to the right in the same drawing by the exhaust pump not shown. The high-frequency power is introduced from the high-frequency power supply 004 through the high-frequency electrode 003 into the inside of the film forming chamber 001 to decompose and excite the source gas, thereby generating the plasma.

The substrate 002, the high-frequency electrode 003, and the source gas introducing portion 005*a* are surrounded by the metal mesh 006 and the generated plasma is substantially confined within the metal mesh 006. Using this deposition apparatus, i-type microcrystalline silicon films were formed. The forming conditions of the i-type microcrystalline silicon films are as shown in Tables 1 to 3 below.

TABLE 1

(Example of forming conditions of i-layer (frequency f = 105 MHz)

Gas flow rates: $SiH_4$ 60 sccm, $H_2$ 1800 sccm
Forming temperature: 250° C.
Forming pressure: 0.25 Torr
VHF (105 MHz) power: 150 W
RF (13.56 MHz) power: 10 W
Forming rate: ~7.0 Å/s

TABLE 2

(Example of forming conditions of i-layer (frequency f = 500 MHz)

Gas flow rates: $SiH_4$ 55 sccm, $H_2$ 1250 sccm
Forming temperature: 400° C.
Forming pressure: 0.025 Torr
VHF (105 MHz) power: 80 W
RF (13.56 MHz) power: 10 W
Forming rate: ~7.0 Å/s

TABLE 3

(Example of forming conditions of i-layer (frequency f = 1000 MHz)

Gas flow rates: $SiH_4$ 40 sccm, $H_2$ 1200 sccm
Forming temperature: 400° C.
Forming pressure: 0.010 Torr
VHF (105 MHz) power: 50 W
RF (13.56 MHz) power: 10 W
Forming rate: ~7.0 Å/s The source gas was $SiH_4$ diluted with a diluent gas of hydrogen. The high-frequency wave for inducing the plasma was one in which the RF wave of the frequency 13.56 MHz was superimposed on the high-frequency wave of the frequency of 50 to 2000 MHz and was supplied through the deposition electrode 003 into the film forming chamber 001. The metal mesh 006 was of Al expanded metal. The mesh was cylindrical and was located between the gas introducing portion 005*a* and the substrate 002 so as to substantially confine the plasma therein. In this example the metal mesh 006 was electrically grounded to the stainless steel film forming chamber 001. The deposition rates in the deposition of the i-type microcrystalline silicon films under the above deposition conditions were compared with that in deposition without use of the metal mesh 006 (in the case of FIG. 1), and the results are shown in FIG. 5. The deposition rates in the deposition with the metal mesh 006 were increased by approximately 26% from that in the deposition without the metal mesh. This is probably because the substantial confinement of the plasma by the metal mesh 006 promoted decomposition and activation of the source gas, thereby generating the plasma of high density and high electron temperature. Similarly, comparison was made as to the number of occurrence of abnormal discharges (sparks) per unit time between the depositions with and without the metal mesh 006. The number of abnormal discharges was decreased from 10 to 3 by adopting the metal mesh 006. This is considered to be the result of quick elimination of abnormal charge accumulation in the plasma by the metal mesh 006. It was thus confirmed that the discharge was able to be stabilized while increasing the deposition rate by substantially confining the plasma by the metal mesh 006.

Figure 6:
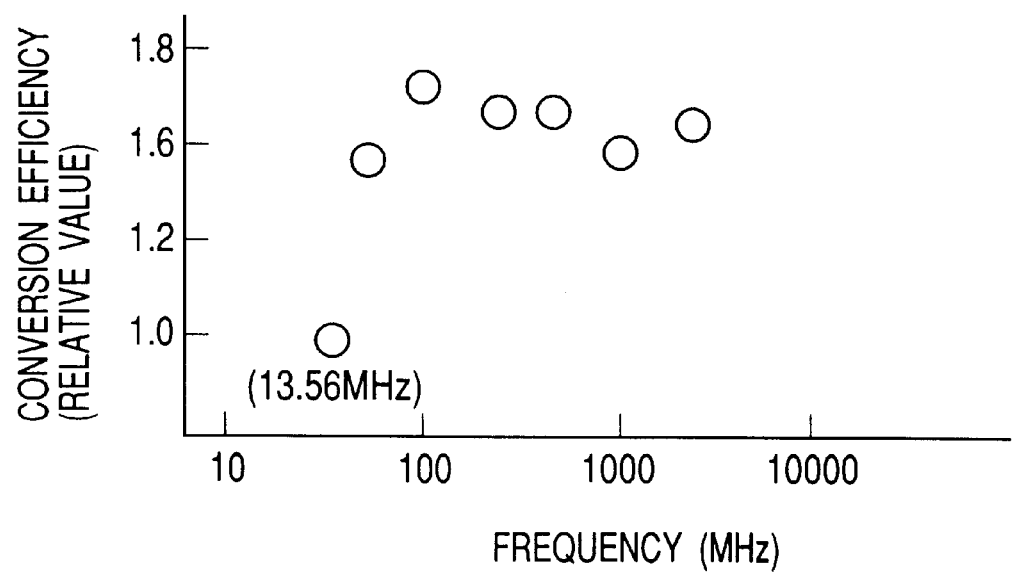
FIG. 6 is a graph showing the relation between frequency upon formation of i-type microcrystalline silicon film and conversion efficiency of solar cells fabricated.
Figure 9:
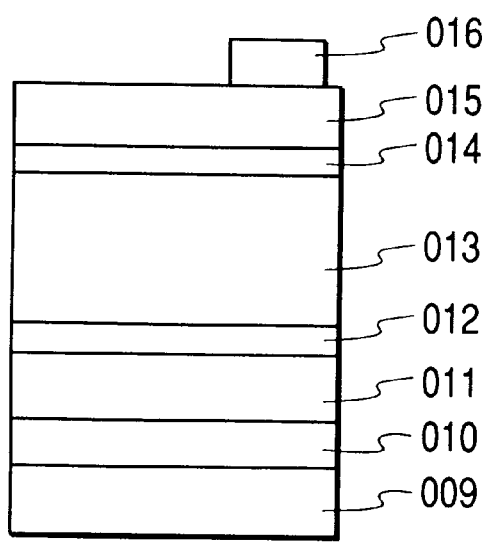
FIG. 9 is a schematic, cross-sectional view showing the structure of a pin type solar cell.

Next, the quality of the i-type microcrystalline silicon films formed using the aforementioned metal mesh 006 was evaluated by producing pin type solar cells and measuring the photoelectric conversion efficiency thereof. The structure of the pin type solar cells is shown in FIG. 9. First, a silver film 010 of 5000 Å thickness and a zinc oxide film 011 of 2 μm thickness was deposited in this order as a back reflecting layer on a stainless steel substrate 009. Then, an n-type microcrystalline silicon film 012 about 300 Å thick, the aforementioned i-type microcrystalline silicon layer 013 about 6000 Å thick, and a p-type microcrystalline silicon film 014 about 100 Å thick are deposited in this order. The forming conditions for the n-type layer and p-type layer are shown in Tables 4 and 5. Subsequently, an indium tin oxide film 015 as a surface electrode also serving as an antireflection film was deposited in 700 Å and a collector electrode 016 of Au was finally deposited in 7000 Å in this order. FIG. 6 shows the change in the conversion efficiency against change in the frequency for forming the i-type microcrystalline silicon film 013. It is seen that good conversion efficiencies were achieved within a range of approximately 50 MHz to 2000 MHz, when compared with that by the conventional high frequency of 13.56 MHz. Next examined were substrate temperature dependence, forming pressure dependence, and input power density dependence of conversion efficiency at each frequency of f=105 MHz, 500 MHz, and 1000 MHz. Examples of the results are shown together in FIGS. 7A, 7B and 7C. When the frequency of the high-frequency power was within a range of 50 to 200 MHz, good conversion efficiencies were obtained where the forming pressure was within a range of 0.1 to 0.5 Torr and where the input power density of high frequency power was within a range of 0.001 to 0.2 $W/cm^3$. When the frequency of the high-frequency power was within a range of 200 to 550 MHz, good conversion efficiencies were obtained where the forming pressure was within a range of 0.01 to 0.3 Torr and where the input power density of high frequency power was within a range of 0.01 to 0.5 $W/cm^3$. When the frequency of the high-frequency power was within a range of 550 to 2000 MHz, good conversion efficiencies were obtained where the forming pressure was within a range of 0.005 to 0.1 Torr and where the input power density of high frequency power was within a range of 0.01 to 1.0 $W/cm^3$. In this way, it became possible to form a high-quality microcrystalline silicon film while maintaining the stability of discharge in the frequency range from 50 to 2000 MHz, by optimizing the forming pressure, the input power density, etc., depending upon the frequency ranges.

Next, Table 6 shows the correlation among the aperture percentage of the metal mesh 006, discharge stability, and leakage of the plasma from the mesh where the forming frequency of the i-type microcrystalline silicon film 013 is 500 MHz. It is seen that good characteristics were achieved within a range of aperture percentage of 30 to 95%. Table 7 shows the correlation among the length of aperture portions of the mesh, discharge stability, and leakage of the plasma from the mesh where the aperture percentage is 60%. Preferred lengths were 5 to 30 mm. Further examined was the relation between the resistivity of the material for the mesh and the stability of discharge. The results are shown in Table 8. Preferred resistivities were not more than $1\times10^{-5}$ $\Omega\cdot$cm, whereupon the number of occurrence of abnormal discharges was extremely small.

TABLE 4

(Forming conditions of n-layer (n-type $\mu$c-silicon: thickness 200 Å))

| | |
|---|---|
| Gas flow rates: | $SiH_4/H_2$ (10%) 4.0 sccm, |
| | $PH_3/H_2$ (2%) 1.0 sccm, $H_2$ 100 sccm |
| Forming pressure: 1.0 Torr | |
| Forming temperature: 230° C. | |
| RF (13.56 MHz) power: 15 W | |
| Forming rate: 0.4 Å/s | |

TABLE 5

(Forming conditions of p-layer (p-type $\mu$c-silicon: thickness 100Å))

| | |
|---|---|
| Gas flow rates: | $SiH_4/H_2$ (10%) 1.0 sccm, |
| | $BF_3/H_2$ (2%) 0.2 sccm, $H_2$ 25 sccm |
| Forming pressure: 2.0 Torr | |
| Forming temperature: 170° C. | |
| RF (13.56 MHz) power: 33 W | |
| Forming rate: 0.6 Å/s | |

TABLE 6

| Aperture percentage (%) | Stability of discharge ○: high Δ: medium x: low | Leak of plasma ○: small Δ: medium x: large |
|---|---|---|
| 20 | Δ | ○ |
| 30 | ○ | ○ |
| 95 | ○ | ○ |
| 99 | x | Δ |

TABLE 7

| Length (mm) | Stability of dishcarge ○: high Δ: medium x: low | Leak of plasma ○: small Δ: medium x: low |
|---|---|---|
| 1 | Δ | ○ |
| 5 | ○ | ○ |
| 30 | ○ | Δ |
| 50 | Δ | x |

TABLE 8

| Resistivity ($\times 10^{-5}$ $\Omega\cdot$cm) | Stability of discharge ○: high Δ: medium x: low |
|---|---|
| 0.3 | ○ |
| 1 | ○ |
| 7 | Δ |
| 15 | Δ |

Example 2

Figure 3:
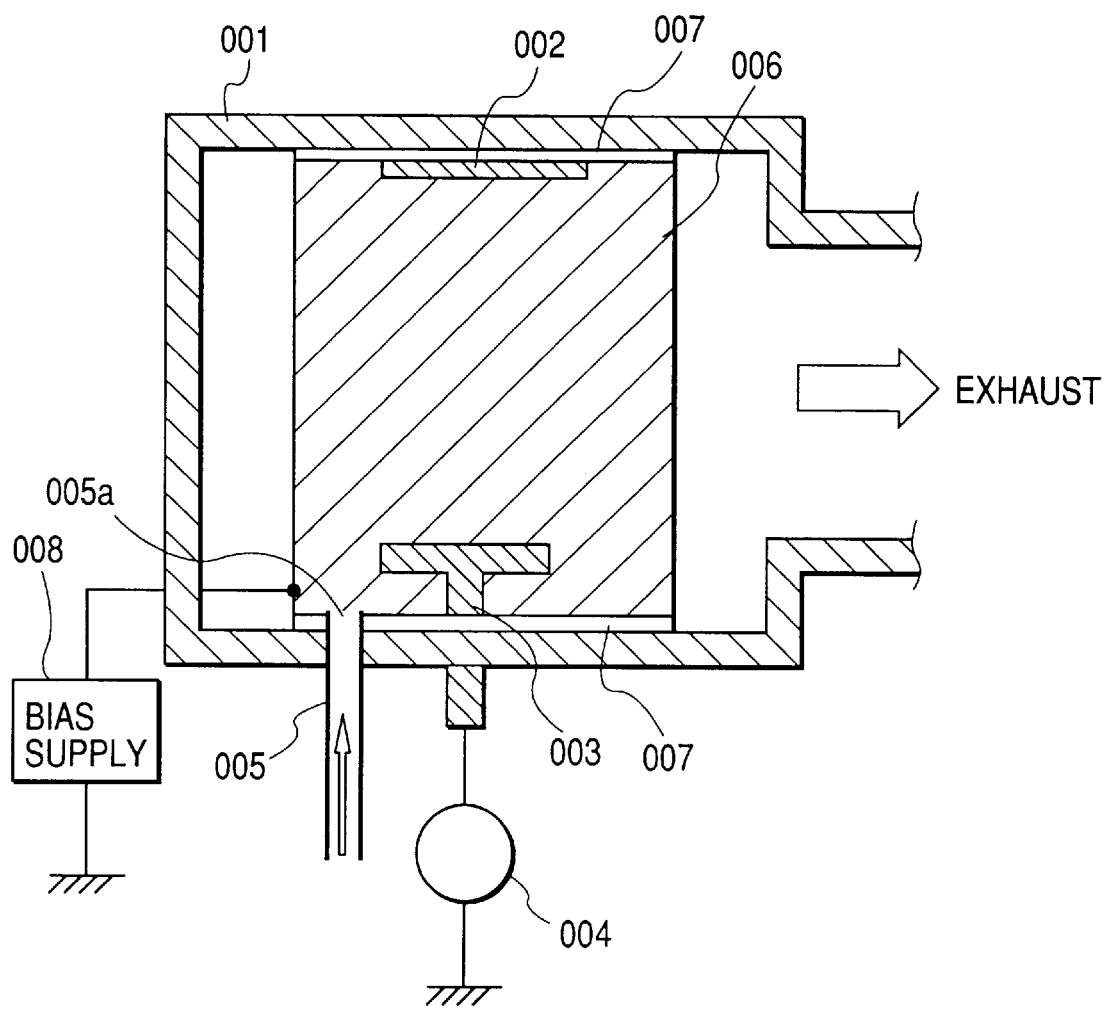
FIG. 3 is a schematic, cross-sectional view showing a film forming apparatus according to Example 2 of the present invention.
Figure 8:
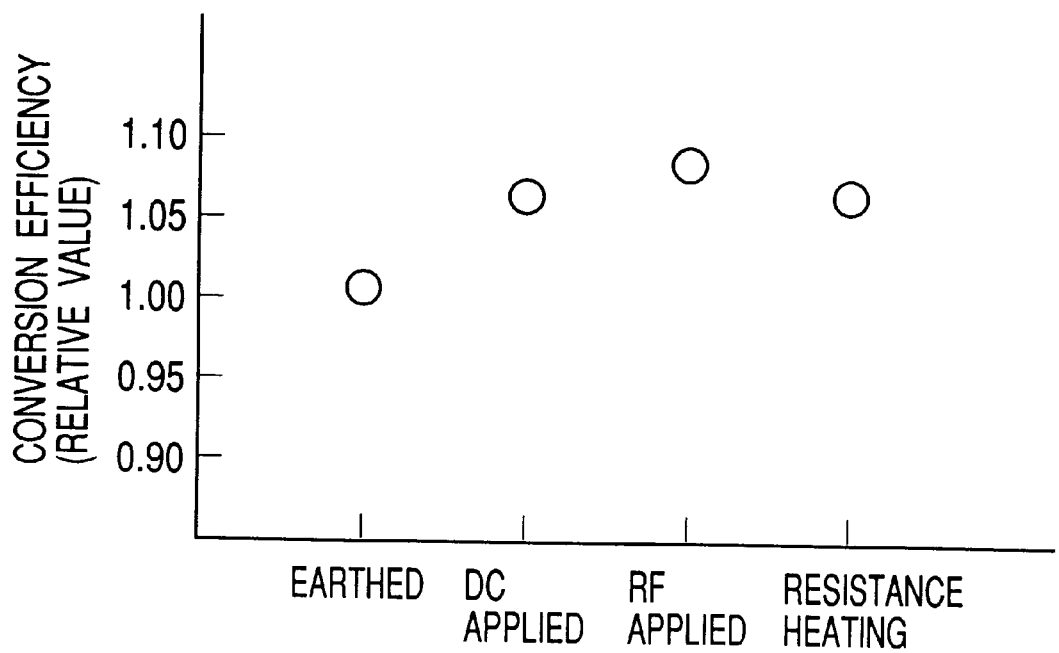
FIG. 8 is a graph showing effects of bias application and resistance-heating to the mesh.

FIG. 3 shows the second example for specifically explaining the present invention. The substrate 002 is held in the top part of the film forming chamber 001 and is heated to be kept at a desired temperature. The film-forming gas is guided through the source gas inlet pipe 005 to be introduced from the bottom part into the inside of the film forming chamber 001. The film-forming gas is exhausted to the right in the same drawing by the exhaust pump not shown. The high-frequency power is supplied from the high-frequency power supply 004 to be guided through the high-frequency electrode 003 into the inside of the film forming chamber 001 to decompose and excite the source gas, thereby generating the plasma. The substrate 002, the high-frequency electrode 003, and the source gas introducing portion 005a are surrounded by the metal mesh 006 and the plasma as generated is substantially confined in the metal mesh 006. In this example the metal mesh 006 is electrically isolated from the film forming chamber 001 by insulating supports 007. In this case, a bias of DC, RF, or the like is applied from a bias power supply 008 to the metal mesh 006, whereby those ions which are advantageous for deposition can be positively confined in the plasma or whereby those ions which are disadvantageous for deposition can be eliminated therefrom. If desired, the ions in the plasma can be accelerated from the metal mesh 006 toward the substrate 002 to supply the energy of the ions to the surface of the substrate so as to activate the surface of the deposited film, which is expected to achieve the effect of improving the quality of the deposited film. FIG. 8 shows conversion efficiencies of pin solar cells where the metal mesh 006 was of Al (aluminum) and a DC bias of +100 V was applied, where the metal mesh 006 was also of Al and an RF bias of 500 W was applied, and where the metal mesh 006 was of W (tungsten) and the metal mesh 006 was energized to heat by DC 5A, comparing them with the case using the grounded Al mesh shown in Example 1. The higher conversion efficiencies were obtained in all the cases of application of DC bias, application of RF bias, and energization-heating (resistance heating) than in the case using the grounded Al mesh, and it is thus understood that the application of DC or RF or the energization-heating to the metal mesh 006 with the plasma being substantially confined in the metal mesh 006 is effective for the improvement in the quality of i-type microcrystalline silicon film 013.

Example 3

Figure 4:
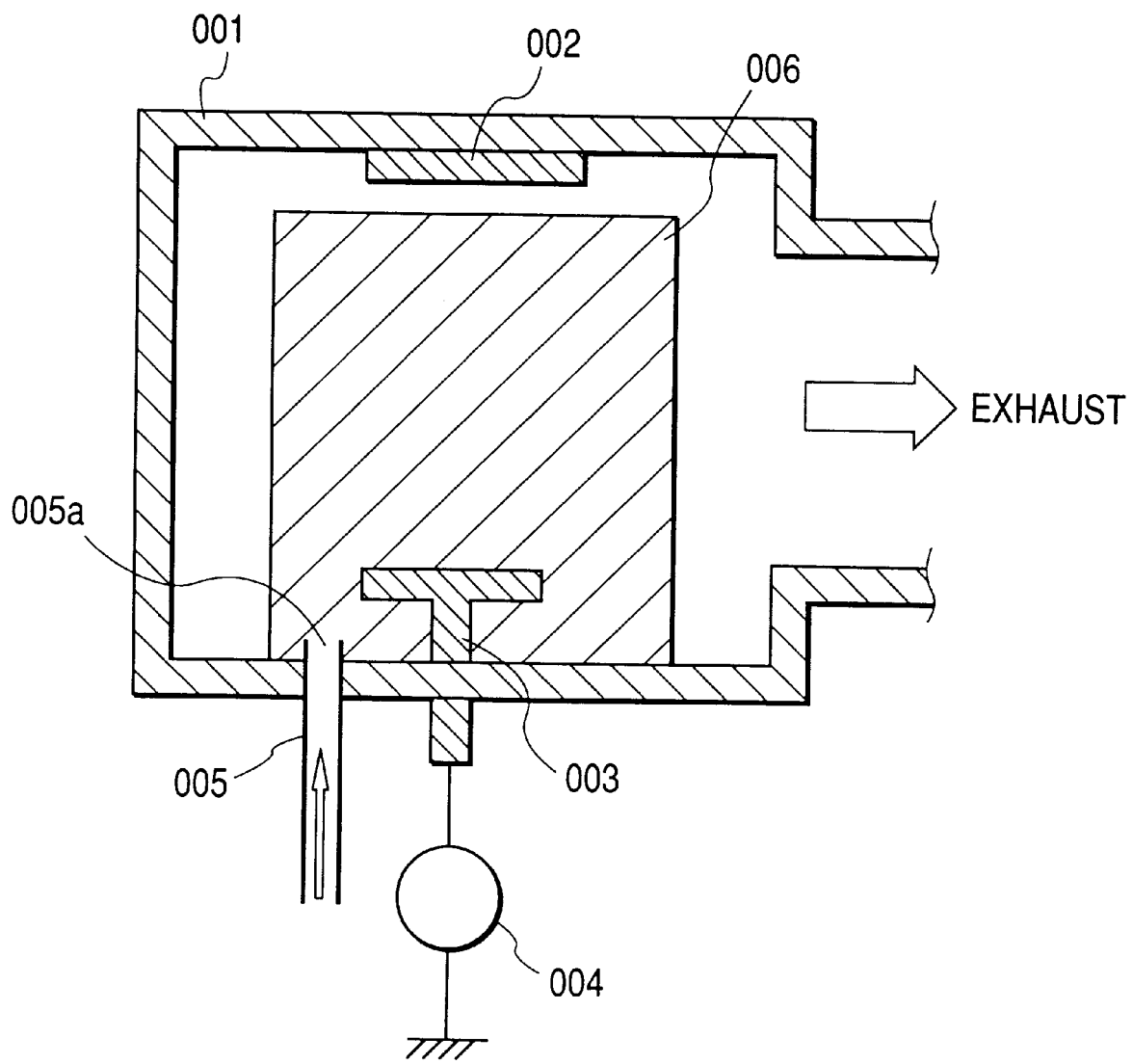
FIG. 4 is a schematic, cross-sectional view showing a film forming apparatus according to Example 3 of the present invention.

FIG. 4 shows the third example for specifically explaining the present invention. The substrate 002 is held in the top part of the film forming chamber 001 and is heated to be kept at a desired temperature. The film-forming gas is supplied through the source gas inlet pipe 005 to be introduced from the bottom part into the inside of the film forming chamber 001. The film-forming gas is exhausted to the right in the same drawing by the exhaust pump not shown. The high-frequency power is supplied from the high-frequency power supply 004 to be introduced through the high-frequency electrode 003 into the inside of the film forming chamber 001 to decompose and excite the source gas, thereby generating the plasma. The high-frequency electrode 003 and the source gas introducing portion 005a are surrounded by the metal mesh 006, and the plasma as generated is substantially confined in the metal mesh 006. In this example the metal mesh 006 has a ceiling portion also formed in the mesh shape. Accordingly, the metal mesh 006 is disposed so as to substantially confine the plasma, between the substrate 002 and the source gas introducing portion 005a, but the metal mesh 006 does not surround the substrate 002 therein. In the same manner as described in Examples 1 and 2, the metal mesh 006 may be electrically grounded to the film forming chamber 001; or, the metal mesh 006 may be electrically insulated and a DC or RF bias may be applied thereto, or it may be energized to heat. In this example, since the plasma is substantially separated from the substrate 002, the substrate 002 is prevented from being damaged by abnormal discharge, so that the yield of elements can be increased greatly. For example, the yield of elements was approximately 80% without use of the mesh, whereas it was able to be raised easily to 90% or higher by enhancing the stability of discharge by the mesh. Further, since the deposition of film is greatly decreased on the portions except for the desired portion, for example, on the inner wall surface of the film forming chamber, there can be obtained the effect of enhancing the maintainability of the chamber.

EFFECTS OF THE INVENTION

As described above, use of the semiconductor thin film forming method according to the present invention allows the semiconductor thin films such as microcrystalline silicon films to be formed with high quality and at high rates, improves the maintainability of the film forming chamber, and increases the throughput in production.

What is claimed is:

1. A method of forming a semiconductor thin film by a plasma CVD process, which comprises introducing into a film forming chamber a source gas through a source gas introducing portion and a high-frequency power through a high-frequency power introducing electrode to generate a plasma in the film forming chamber, thereby forming the semiconductor thin film on a substrate arranged in the film forming chamber, wherein the frequency of the high-frequency power is within a range of 50 to 2000 MHz; the input power density of the high-frequency power is within a range of 0.001 to 1.0 W/cm$^3$; the forming pressure is within a range of 0.005 to 0.5 Torr; and the temperature of the substrate is within a range of 150 to 500 ° C., and wherein a metal mesh having an aperture percentage within a range of from 30 to 95% and the aperture portion lengths are in a range of 5 to 30 mm is disposed so as to surround the high-frequency power introducing electrode such that the plasma is substantially confined between the substrate and the source gas introducing portion, thereby forming the semiconductor thin film on the substrate.

2. The method according to claim 1, wherein the frequency of the high-frequency power is within a range of 50 to 200 MHz; the temperature of the substrate is within a range of 150 to 500° C.; the forming pressure is within a range of 0.1 to 0.5 Torr; and the input power density of the high-frequency power is within a range of 0.001 to 0.2 W/cm$^3$.

3. The method according to claim 1, wherein the frequency of the high-frequency power is within a range of 200 to 550 MHz; the temperature of the substrate is within a range of 150 to 500° C.; the forming pressure is within a range of 0.01 to 0.3 Torr; and the input power density of the high-frequency power is within a range of 0.01 to 0.5 W/cm$^3$.

4. The method according to claim 1, wherein the frequency of the high-frequency power is within a range of 550 to 2000 MHz; the temperature of the substrate is within a range of 150 to 500° C.; the forming pressure is within a range of 0.005 to 0.1 Torr; and the input power density of the high-frequency power is within a range of 0.01 to 1.0 W/cm$^3$.

5. The method according to claim 1, wherein the metal mesh is electrically earthed to the film forming chamber.

6. The method according to claim 1, wherein the metal mesh is electrically insulated from the film forming chamber and a DC bias is applied to the metal mesh.

7. The method according to claim 1, wherein the metal mesh is electrically insulated from the film forming chamber and an RF bias is applied to the metal mesh.

8. The method according to claim 1, wherein the metal mesh is subjected to resistance heating.

9. The method according to claim 1, wherein the metal mesh is one formed by knitting a material of a wire shape.

10. The method according to claim 1, wherein the metal mesh is one formed by expanding a metal sheet.

11. The method according to claim 1, wherein the metal mesh is one formed by punching a metal sheet.

12. The method according to claim 1, wherein the metal mesh is comprised of at least one element selected from Fe, Al, Cu, Ni, and W.

13. The method according to claim 1, wherein a resistivity of a material of the metal mesh is not more than $1 \times 10^{-5}$ Ω·cm.

14. The method according to claim 1, wherein the semiconductor thin film is an amorphous semiconductor containing a microcrystalline layer, or a microcrystalline semiconductor.

15. The method according to claim 1, wherein the metal mesh is disposed so as to further surround the substrate.

16. The method according to claim 1, wherein the film-forming gas in the space surrounded by the metal mesh is exhausted through an exhaust pass not surrounded by the metal mesh.

* * * * *

UNITED STATES PATENT AND TRADEMARK OFFICE
CERTIFICATE OF CORRECTION

PATENT NO. : 6,057,005
DATED : May 2, 2000
INVENTOR(S) : Tomonori Nishimoto

It is certified that error appears in the above-identified patent and that said Letters Patent is hereby corrected as shown below:

Drawing sheet 1
Figure 1, Replace Figure 1 with attached amended Figure 1.

Column 9
Line 36, "$H_2 25$ sccm" should read --$H_2$ 35 sccm--.

Line 61, "x: low" (second occurrence) should read -- x: large --.

Signed and Sealed this

Twenty-fifth Day of September, 2001

Attest:

NICHOLAS P. GODICI
Attesting Officer    Acting Director of the United States Patent and Trademark Office